United States Patent [19]

Caillat

[11] Patent Number: 4,511,870
[45] Date of Patent: Apr. 16, 1985

[54] FOCUSSING SOLENOID, APPLICATION THEREOF AND A PROCESS FOR MANUFACTURING SAME

[75] Inventor: Pierre Caillat, Paris, France

[73] Assignee: Thomson-CSF, Paris, France

[21] Appl. No.: 470,526

[22] Filed: Feb. 28, 1983

[30] Foreign Application Priority Data

Mar. 5, 1982 [FR] France ................... 82 03731

[51] Int. Cl.³ .................. H01F 5/02; H01F 7/06
[52] U.S. Cl. .................... 335/213; 335/210; 242/7.07; 29/605
[58] Field of Search ............. 335/210, 213, 282, 299; 29/605; 242/7.07

[56] References Cited

U.S. PATENT DOCUMENTS 2,763,805  9/1956  Bendell ................ 313/84
2,982,888  5/1961  Whearly ............... 335/299
4,337,448  6/1982  Van Rooy ............. 335/210

FOREIGN PATENT DOCUMENTS 0019328  11/1980  European Pat. Off. .
2181464  12/1973  France ................ 335/299

Primary Examiner—George Harris
Attorney, Agent, or Firm—Roland Plottel

[57] ABSTRACT

The present invention provides a focussing solenoid for focussing an electron beam in a picture taking tube. This focussing solenoid comprises a sleeve which has a helical etching in which are housed the turns of a first layer of wire. For all the other layers of wire wound in a helix about the sleeve, the slope of the turns of the helix with respect to the sleeve is substantially the same and the turns of one layer are guided by the turns of the preceding layer. Connections connect the layers together so that all the layers have the same winding direction about said sleeve.

20 Claims, 11 Drawing Figures

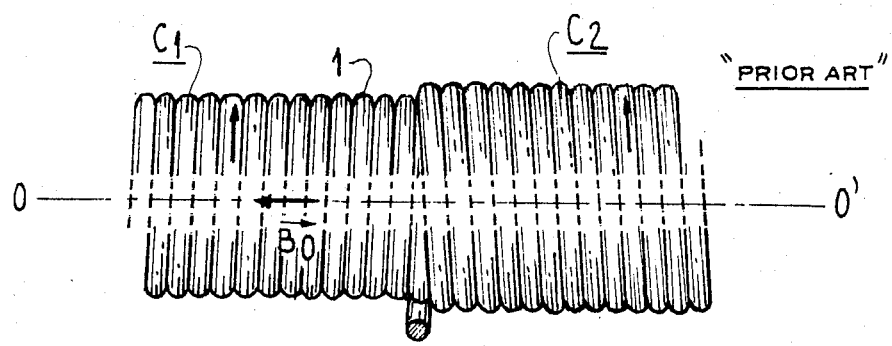
FIG_1 "PRIOR ART"
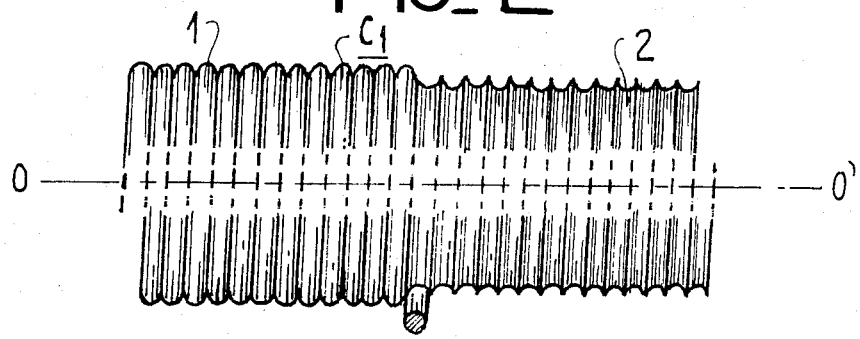
FIG_2
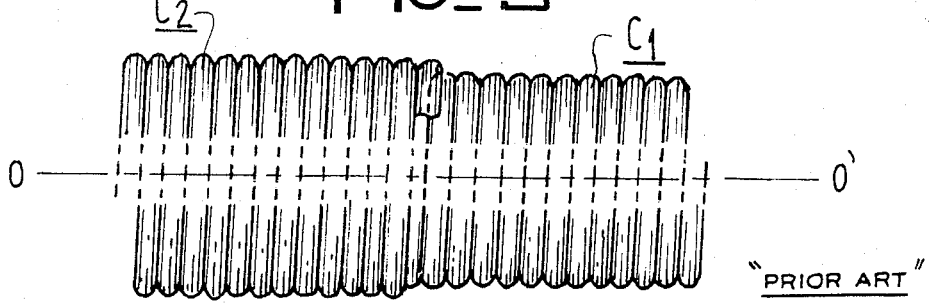
FIG_3 "PRIOR ART"
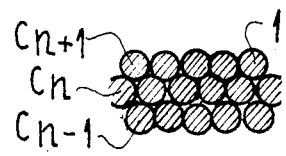
FIG_4-a
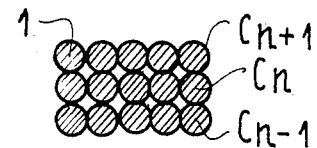
FIG_4-b FIG_5
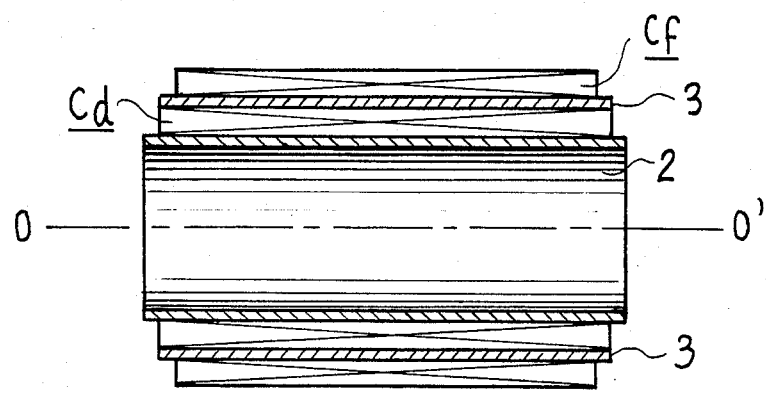
FIG_6
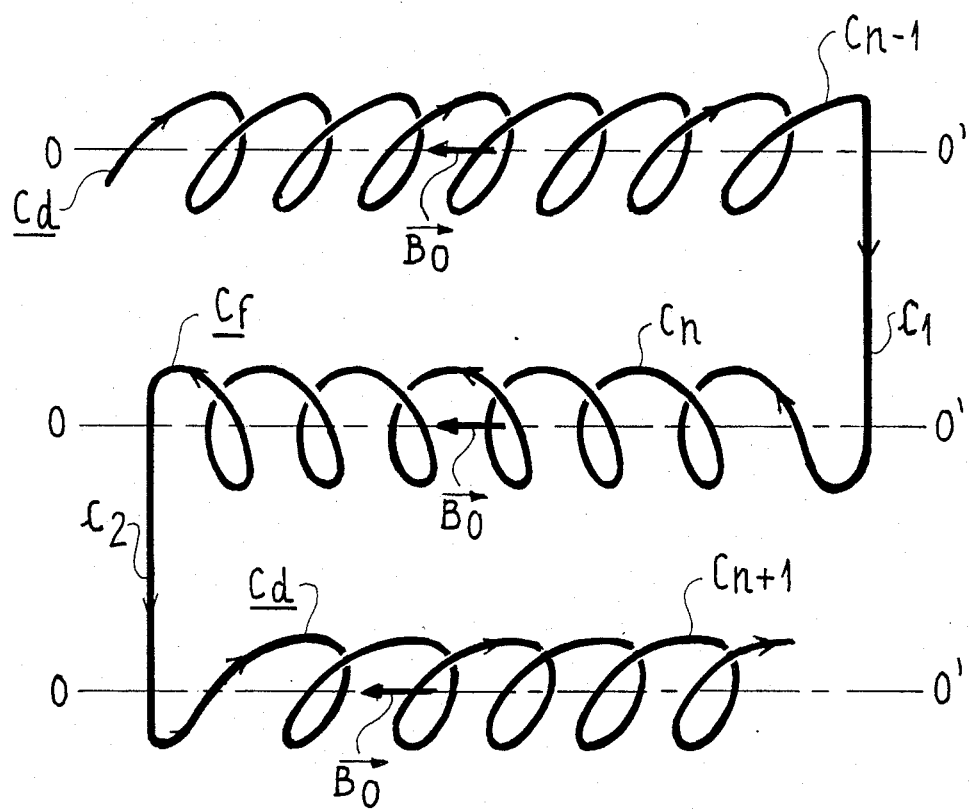

FIG_7
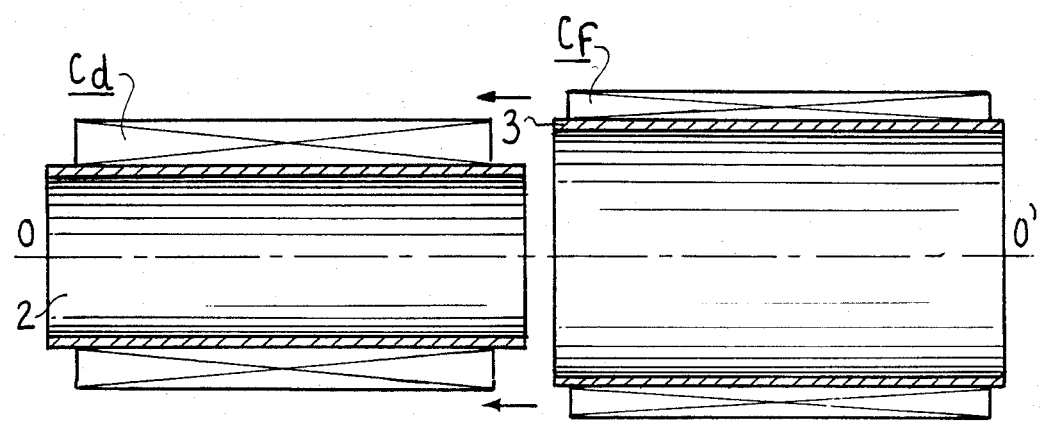
FIG_8
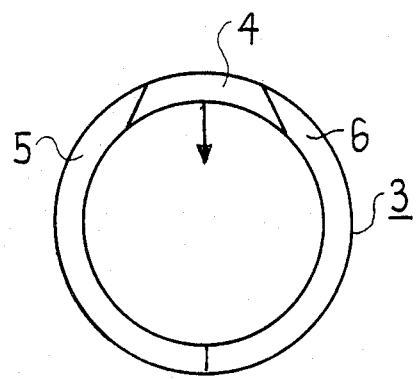

FIG_9
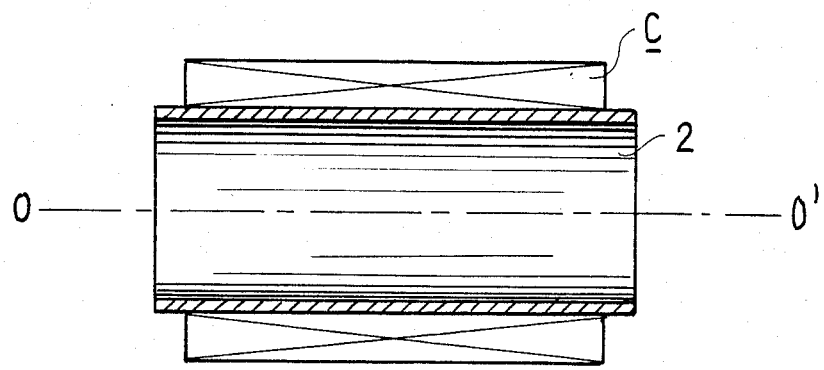
FIG_10
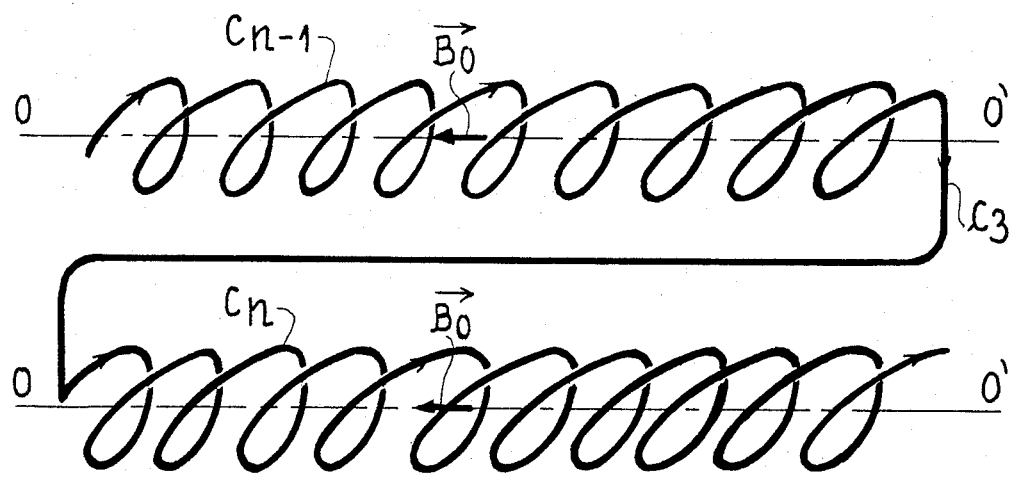

FOCUSSING SOLENOID, APPLICATION THEREOF AND A PROCESS FOR MANUFACTURING SAME

BACKGROUND OF THE INVENTION

The present invention relates to a focussing solenoid. It also relates to a process for manufacturing same.

The present invention relates to the field of focussing an electron beam in an electron tube. In an electron tube, it is known to provide a focussing device whose purpose is to oppose the natural divergence of the electrons of the beam. This device often creates a magnetic field directed along the axis of the tube and causing the rotation about this axis of the divergent electrons. In some applications, the requirements for concentrating the beam are particularly severe. This is the case for example with electron tubes intended for taking pictures, electron microscopes and ultrahigh frequency electron tubes.

In picture taking tubes, for focussing the beam it is known to use a solenoid, disposed around the tube and formed by an insulated metal wire, made from enamelled copper for example, which is wound in a helical form around an insulating sleeve, made for example from epoxy glass. The turns of the helix are jointing and the solenoid comprises several superimposed layers of wire, wound in the same direction around the sleeve.

Thus, for example, on a sleeve of 3 cm diameter and 8 cm long, are superimposed 20 layers of 300 turns each using a wire having a diameter of 25/100th mm.

The wire is wound on the sleeve using a winding machine comprising a wire guide and the laying of the turns is controlled by hand. After winding one layer, the next layer is wound thereabove without cutting the wire but reversing the slope of the turns with respect to the axis. Thus, the winding direction of the wire about the sleeve is always the same and the current always flows in the same direction which allows, in a first approximation, a uniform magnetic field to be obtained parallel to the axis. Two flanges fixed at the ends of the sleeve hold the wire layers in place.

The problem which arises is that the distribution of the turns of the different layers is not even and then the type of focussing solenoid which has just been described gives poor characteristics to the picture taking tube with which it is associated.

Thus, this solenoid causes a parasite deflection of the image which results in "frame offset". It also causes an error of orthogonality. The rapid return of the beam controlled by the deflection coils forms a parasite which is transmitted to the target by the focussing solenoid which disturbs the video signal. Finally, it can be observed that the modulation rate varies from one solenoid to another and also a lack of homogeneity of resolution of the tube can be observed.

SUMMARY OF THE INVENTION

The present invention provides a new focussing solenoid which overcomes the defects due to known focussing solenoids by providing an even distribution of the turns. This new solenoid also has the advantage of being easier to manufacture.

The present invention relates to a focussing solenoid whose sleeve, around which the wire is wound, is cylindrical and bears a helical etching in which the turns of the first wire layer are housed.

BRIEF DESCRIPTION OF THE DRAWINGS

Other objects, features and results of the invention will be clear from the following description given by way of non limiting example and illustrated by the accompanying figures which represent:

FIG. 1, a diagram illustrating the construction of a focussing solenoid of the prior art;

FIGS. 2 and 3, diagrams illustrating the construction of a focussing solenoid in accordance with the invention;

FIGS. 4a and 4b, sectional views illustrating the positioning of the different wire layers, respectively, in a solenoid in accordance with the invention and in a solenoid of the prior art;

FIGS. 5 and 9, two longitudinal sectional views of two embodiments of a solenoid in accordance with the invention;

FIGS. 6 and 10, two diagrams showing how the connections are formed between the layers for the embodiments of FIGS. 5 and 9;

FIG. 7, two diagrams illustrating the process for manufacturing a solenoid in accordance with the invention; and FIG. 8, a sectional view of a removable sleeve.

In the different figures, the same references designate the same elements but, for the sake of clarity, the sizes and proportions of the different elements have not been respected.

DESCRIPTION OF THE PREFERRED EMBODIMENTS

FIG. 1 illustrates schematically the construction of a focussing solenoid of the prior art.

This solenoid is obtained by winding an insulated metal wire 1 on an insulating cylindrical sleeve which is not shown in the figure.

The wire is wound in the form of a helix around the sleeve and the turns of the helix are jointing as has been shown in the figure. After winding the first layer $C_1$, the second one $C_2$ is wound thereover, without cutting the wire, but reversing the slope of the turns with respect to the axis, while keeping the same pitch for the helix. In FIG. 1, it can be seen that for layer $C_1$ the turns of the helix are sloping to the right with respect to axis OO' of the sleeve, whereas for layer $C_2$ the turns of the helix are sloping to the left. Thus, the current always flows in the same direction throughout the solenoid. In FIG. 1, an arrow shows the flow direction of the current in wire layer $C_1$. The current flows in this layer from bottom to top in the figure, that is to say in an anti-clockwise direction if the solenoid is viewed from the left-hand side.

In the figure, there has also been shown by an arrow the flow direction of the current in wire layer $C_2$ and it can be seen that the current also flows in this layer in an anti-clockwise direction if the solenoid is viewed from the left-hand side. There is then created a uniform magnetic field $B_O$ directed along the axis OO' of the tube. After winding the second layer, the third layer is wound while sloping the turns to the right and so on for the other layers, the slope of the turns with respect to the axis being reversed each time.

FIG. 2 shows schematically the construction of a solenoid in accordance with the invention.

In the right-hand part of FIG. 2 is shown the insulating sleeve 2 which carries the wire layers.

In accordance with the invention, this sleeve carries a helical etching in which are housed the turns of the first layer $C_1$ of wire 1 which is shown in the left-hand part of FIG. 2.

The pitch of the helix etched on the sleeve must be very slightly greater than the diameter of the wire so that the wire turns are substantially jointing.

Thus, for example, if an enamelled copper wire is used having a diameter of 25/100 mm, a helix having a 26/100 pitch is etched on the sleeve.

The depth of the etching formed on the sleeve is of the order of half the diameter of the wire.

In the example given above, the depth of the etching is 1/10. The fire wire layer $C_1$ projects then from the etching by about half the diameter of the wire.

In FIGS. 1 and 2, it has been shown by broken lines that the proportions between the height of the wire turns (or the height of the etching in the sleeve) and their width could not be represented in the figures for reasons of clarity. In fact, this ratio is greater than 100.

Thus, it will be readily understood that, if a sleeve of 3 cm in diameter having a helical etching with a 26/100 pitch and a depth of 1/10 is examined with the naked eye, the surface of the sleeve seems almost smooth and, in any case, less contrasty than what is shown in FIG. 2.

This etching in the sleeve is however sufficient for the turns of the first layer $C_1$ to be properly held in position. In so far as the construction of the solenoid is concerned, it is still achieved by using a winding machine and a wire guide but it can be seen that it is no longer necessary to guide the wire by hand except for the first turns, for the wire then positions itself in the etching of the sleeve.

The distribution of the turns of the first layer on the sleeve is substantially perfect and the turns are therefore substantially perpendicular to the axis of the sleeve.

In solenoids of the prior art, since the sleeve is smooth, the distribution of the turns of the first layer on the sleeve is generally much less even and, in any case, an even distribution of the turns is much more difficult to obtain.

FIG. 3 shows that in the solenoid of the invention, for each wire layer, the slope of the turns of the helix with respect to the sleeve is the same. Thus, in FIG. 3, it can be seen that, not only for layer $C_2$ but also for layer $C_1$, the turns of the helix are sloped to the right with respect to axis OO'. According to the invention, the first layer $C_1$ of wire which projects from the etching of the sleeve serves for guiding the second layer $C_2$ whose turns have the same slope as those of the first one. And so on, according to the invention, each wire layer is used for positioning the following wire layer. Thus, all the wire layers have well distributed turns, substantially perpendicular to the axis of the sleeve and, in forming the solenoid, for each layer it is only necessary to guide the wire by hand for the first turns.

On the contrary, in the solenoids of the prior art, since the turns of one layer have a slope the opposite of that of the turns of the following layer, there is no guiding of the wire and the turns of the different layers are badly distributed and difficult to position correctly. It can moreover be seen, by a close examination of a solenoid of the prior art, that the surface presents a moiré effect indicating poor distribution of the turns.

FIGS. 4a and 4b are sections showing schematically how the different wire layers, $C_{n+1}$, $C_n$ and $C_{n-1}$, are positioned.

In the solenoid of the invention, it can be seen in FIG. 4a that the turns of one layer are guided by the turns of the preceding layer and are housed in the helical groove due to this preceding layer. In the solenoid of the prior art, it can be seen in FIG. 4b that there is no guiding of the turns of a layer by those of the preceding layer since the slope of the turns is reversed from one layer to the next. The turns of one layer are not housed in the helical groove provided by the preceding layer.

It was seen in FIG. 3 that, in the solenoid of the invention for all the wire layers wound in a helix around a sleeve, the slope of the turns of the helix with respect to the sleeve is substantially the same. There arises however the problem of the connection between the different wire layers so that all the layers of the solenoid have the same winding direction around the sleeve.

FIG. 5 is a longitudinal sectional view along axis OO' showing schematically one embodiment of a solenoid in accordance with the invention which advantageously resolves the problem of connection between the layers.

In the embodiment of FIG. 5, the solenoid of the invention comprises a first sleeve 2 such as the one in FIG. 2. This sleeve 2 carries half of the layers of the solenoid. There is designated by $C_d$ the whole of the layers carried by this sleeve 2.

The first wire layer is formed by housing the turns of the helix in the helical etching of sleeve 2.

The wire is cut at the end of the first layer.

Above the first layer is wound a second layer using the first layer as guide, as is shown in FIG. 3.

The wire is cut at the end of the second layer.

Thus, half of the layers are wound about the sleeve, cutting the wire at the end of each layer, and so that the slope of the turns of the helix with respect to the sleeve is substantially the same for all these layers.

Around layers $C_d$ is introduced a second sleeve 3, similar to the first one and having the same helical etching but formed in the opposite direction.

Around this second sleeve is wound the other half of the layers of the solenoid which is designated by $C_f$, just as layers $C_d$ were wound about sleeve 2. That is to say that the first layer is housed in the etching of the sleeve, the wire is cut after each layer and for all the layers, the slope of the turns of the helix with respect to the sleeve is substantially the same.

So that all the layers of the solenoid run in the same direction around the sleeve, connections are formed between the ends of a layer formed about one sleeve and the ends, situated on the same side of the sleeves, of two other layers formed about the other sleeve.

There is shown in FIG. 6 the connections which must be formed for suitably connecting a layer $C_n$ sloping to the left, belonging to layers $C_f$ wound around the second sleeve, to two layers $C_{n-1}$ and $C_{n+1}$ sloping to the right belonging to layers $C_d$ wound around the first sleeve.

With the connection $c_1$, the end of layer $C_{n-1}$ situated on the right of the sleeves is connected to the end of layer $C_n$ situated on the right of the sleeves and, with connection $c_2$, the end of layer $C_n$ situated on the left of the sleeves is connected to the end of layer $C_{n+1}$ situated on the left of the sleeves.

It can be seen in FIG. 6 that all the layers run thus in the same direction with respect to the sleeves disposed along axis OO'. The current flows in all the layers of the solenoid, viewed from the left, in an anti-clockwise direction. Thus, there is created a uniform magnetic field $\vec{B}_O$ along axis OO'.

The connections such as $c_1$ and $c_2$ between the ends situated on the same side of the sleeves of two adjacent layers are formed by twisting together two short pieces of wire which are then soldered, by plunging them into a tank of molten tin for example. The connections thus formed cannot produce troublesome parasites.

Embodiments of the invention are known closely related to the one which has just been described and which are distinguished therefrom because they comprise more than two sleeves. Each sleeve then has the same helical etching as that of the preceding one, but in the opposite direction.

In a particular embodiment of the invention, each sleeve only carries a single layer housed in the helical etching of the sleeve.

There arises however the problem of the additional space occupied by the sleeves.

A process will now be described which allows all the sleeves, except the first one, to be omitted while keeping the qualities of the solenoids in accordance with the invention.

Let us take for example the case of a solenoid using two sleeves.

The first half $C_d$ of the layers is wound about the first sleeve 2, cutting the wire at each layer, and winding all the layers while keeping the same slope, this first step is shown in the left-hand part of FIG. 7.

Then a second sleeve 3 is used whose external diameter is equal to the external diameter of the first sleeve covered with its wire layers. This second sleeve is etched in a direction opposite the first one and around this second sleeve is wound the second layer half $C_f$, as that was done around the first one. This second step is shown in the right-hand part of FIG. 7.

The wire which is used for forming at least this other layer half $C_f$ has the property of becoming adherent under the action of heat.

After winding the wire, these layers $C_f$ are bonded together using a hot air jet or by causing a high intensity current to flow through the wire.

Then, the second sleeve is removed. For that, a three part removable sleeve may be used such as the one shown in FIG. 8. It is sufficient to remove the central part 4 and the lateral parts 5 and 6 are released.

Then the second half $C_f$ of the layers is fitted on to the first half $C_d$ of the layers. All that is then required is to form the connections between the different layers.

This process may of course be used when more than two sleeves are used.

In FIG. 9, another embodiment of the solenoid of the invention is shown which only uses one sleeve.

In this embodiment of the invention, for all the wire layers C wound in a helix about sleeve 2, the slope of the turns of the helix with respect to the sleeve is substantially the same.

In this embodiment, connections such as connection $c_3$ in FIG. 10 connect the end of one layer such as $C_{n-1}$ to the end of the following layer $C_n$ situated on the other side of sleeve 2.

Thus, in FIG. 10, connection $c_3$ connects the right-hand end of layer $C_{n-1}$ to the left-hand end of layer $C_n$.

Because of their large size, these connections introduce more parasites than the connections formed for the embodiments of FIGS. 5 to 8.

In the solenoids of the invention, generally epoxy glass sleeves are used. Because of their manufacture, these sleeves have a fairly uneven external surface which is often off-centre with respect to the tube axis. On the other hand, their internal surface is perfectly centered with respect to this axis. In accordance with the invention, sleeves are used having a helical etching on their external surface. It is sufficient to form this etching by taking as basis the inner wall of the sleeve so as to remove the disadvantages due to defects in the external surface of the sleeves. It should be pointed out that in the solenoids of the prior art, if these epoxy glass sleeves are used, either the disadvantages due to defects in the sleeves must be accepted or their external surface must be modified which is a more delicate operation to achieve than the etching in the sleeve.

So that the turns of the helixes of the different layers have, with respect to the sleeve, substantially the same slope or a substantially opposite slope, the pitch of the last layers of each sleeve is slightly increased.

The solenoids of the invention have the advantage of being more easily manufactured than known solenoids, in particular because the wire no longer has to be guided by hand except for the first turns of each layer, after which it positions itself.

In the solenoids of the invention, the distribution of turns in the different layers is practically perfect and the turns are then substantially perpendicular to the axis of the tube. Thus, an improvement has been noted in the characteristics of the picture taking tubes with which these solenoids are associated.

In particular, it has been noted that,

"frame offset" and orthogonality error are suppressed, parasites due to the rapid return of the beam controlled by the deflection coils are suppressed.

It has also been noted that the modulation rate varies little from one solenoid to another.

Furthermore, the homogeneity of resolution of the tube is improved.

Generally, the focussing solenoids of the invention present reproducible characteristics. This is an important advantage for these solenoids are often used in color picture taking tubes where three focussing solenoids are required having closely related characteristics.

The preceding description has been made while considering the case of picture taking tubes, but the solenoid of the invention may be used in other fields such as electron microscopes or ultra-high frequency electron tubes where the requirements for concentrating the beam are particularly severe.

The invention may also be used for the manufacture of transformers or motors.

What is claimed is:

1. In a focussing solenoid formed by an insulated wire wound in the form of a helix around an insulating cylindrical sleeve, the turns of the helix being jointing and the solenoid comprising several superimposed wire layers having the same winding direction around the sleeve, said sleeve having a helical etching in which the turns of the first layer are housed, and the slope of the turns of the helix with respect to said sleeve of each of the wire layers wound in a helix around the sleeve is substantially the same, connecting means being provided between the wire layers to obtain a substantially uniform magnetic field parallel to the sleeve axis.

2. The solenoid as claimed in claim 1 wherein the connecting means connect one end of one layer to one end of the next layer, situated on the other side of the sleeve.

3. In a focussing solenoid formed by an insulated wire wound in the form of a helix around an insulating cylindrical sleeve, the turns of the helix being jointing and the solenoid comprising several superimposed wire layers having the same winding direction around the sleeve, said sleeve having a helical etching in which the turns of the first layer are housed, said solenoid comprising:

several sleeves having a helical etching in which are housed the turns of a layer of wire, each sleeve having the same helical etching as that of the preceding one, but in the opposite direction, the slope of the turns of the helix with respect to the sleeve for all the wire layers wound in a helix about the same sleeve, being substantially the same, the wire being cut after each layer, and connections connecting the ends of one layer to the ends, situated on the same side of the sleeves, of two other layers formed around another sleeve.

4. In a focussing solenoid formed by an insulated wire wound in the form of a helix around an insulating cylindrical sleeve, the turns of the helix being jointing and the solenoid comprising several superimposed wire layers having the same winding direction around the sleeve, said sleeve has a helical etching in which the turns of the first layer are housed, the first layer, whose turns are housed in the helical etching of said sleeve, is followed by other layers wound in a helix around said sleeve, the slope of the turns of the helix of all these layers with respect to the sleeve being substantially the same, this first series of layers is followed by other series of layers and, for each series, the slope of the helix with respect to said sleeve is substantially the same and is opposite that of the turns of the layers of the preceding series, the layers of the other series are bonded together, the wire is cut after each layer, connections connect the ends of one layer to the ends, situated on the same side of the sleeve, of two other layers forming part of another series.

5. The solenoid as claimed in claim 3, comprising two sleeves each carrying half of the layers.

6. The solenoid as claimed in claim 4, wherein two series of layers are provided.

7. The solenoid as claimed in claim 4 wherein the bonded layers of the other series are formed from a wire which, under the action of heat, has the property of becoming adherent.

8. The solenoid as claimed in claim 6, wherein the bonded layers of the other series are formed from a wire which, under the action of heat, has the property of becoming adherent.

9. The solenoid as claimed in claim 3, wherein each connection is formed by two wire parts belonging to two different layers which are twisted together and soldered.

10. The solenoid as claimed in claim 4, wherein each connection is formed by two wire parts belonging to two different layers which are twisted together and soldered.

11. The solenoid as claimed in claim 1 wherein each sleeve is made from epoxy glass and the etching formed by using as basis the inner wall of the sleeve.

12. The solenoid as claimed in claim 3, wherein each sleeve is made from epoxy glass and the etching formed by using as basis the inner wall of the sleeve.

13. The solenoid as claimed in claim 1, wherein the last layers of each sleeve are wound in the form of a helix whose pitch is slightly greater than that of the first layers, so that the turns of the helixes of the different layers have, with respect to the sleeve, substantially the same slope or a substantially opposite slope.

14. The solenoid as claimed in claim 3, wherein the last layers of each sleeve are wound in the form of a helix whose pitch is slightly greater than that of the first layers, so that the turns of the helixes of the different layers have, with respect to the sleeve, substantially the same slope, or a substantially opposite slope.

15. The solenoid as claimed in claim 1 wherein the pitch of the helix etched in each sleeve is very slightly greater than the diameter of the wire and the depth of the etching is of the order of half the diameter of the wire.

16. The solenoid as claimed in claim 3, wherein the pitch of the helix etched in each sleeve is very slightly greater than the diameter of the wire and the depth of the etching is of the order half the diameter of the wire.

17. The solenoid as claimed in claim 11, wherein the wire has a diameter of 25/100th and the helix etched in each sleeve is 26/100th and the depth of the etching is 1/10th.

18. A process for manufacturing a solenoid as claimed in claim 5, comprising the following steps:

the wire is wound in a helix about said first sleeve by fitting the turns of the first layer into the etching in the sleeve, cutting the wire after each layer and winding the other layers around the sleeve while keeping substantially the same slope of the turns of the helix with respect to the sleeve, then a second sleeve is used whose external diameter is equal to the external diameter of the first sleeve covered with its wire layers, said second sleeve being etched in a direction opposite the first one, the wire is wound around this second sleeve in the same way as around the first one, the wire layers covering said second sleeve are bonded together by heating the wire which has the property of becoming adherent under the action of heat, said second sleeve is removed, this second series of layers is fitted around the first series, and thus several series of layers are formed, the connections are formed between the layers.

19. A process for manufacturing a solenoid as claimed in claim 6, comprising the following steps:

the wire is wound in a helix about said first sleeve by fitting the turns of the first layer into the etching in the sleeve, cutting the wire after each layer and winding the other layers around the sleeve while keeping substantially the same slope of the turns of the helix with respect to the sleeve, then a second sleeve is used whose external diameter is equal to the external diameter of the first sleeve covered with its wire layers, said second sleeve being etched in a direction opposite the first one, the wire is wound around this second sleeve in the same way as around the first one, the wire layers covering said second sleeve are bonded together by heating the wire which has the property of becoming adherent under the action of heat, said second sleeve is removed, this second series of layers is fitted around the first series, and thus several series of layers are formed, the connections are formed between the layers.

20. A process for manufacturing a solenoid as claimed in claim 7, comprising the following steps:

the wire is wound in a helix about said first sleeve by fitting the turns of the first layer into the etching in the sleeve, cutting the wire after each layer and winding the other layers around the sleeve while keeping substantially the same slope of the turns of the helix with respect to the sleeve, then a second sleeve is used whose external diameter is equal to the external diameter of the first sleeve covered with its wire layers, said second sleeve being etched in a direction opposite the first one, the wire is wound around this second sleeve in the same way as around the first one, the wire layers covering said second sleeve are bonded together by heating the wire which has the property of becoming adherent under the action of heat, said second sleeve is removed, this second series of layers is fitted around the first series, and thus several series of layers are formed, the connections are formed between the layers.

* * * * *